United States Patent [19]
Brede et al.

[11] Patent Number: 5,726,607
[45] Date of Patent: Mar. 10, 1998

[54] PHASE LOCKED LOOP USING A COUNTER AND A MICROCONTROLLER TO PRODUCE VCXO CONTROL SIGNALS

[75] Inventors: Jeffrey Brede; Adam Opoczynski, both of Eden Prairie; James W. Ott, Albertville, all of Minn.

[73] Assignee: ADC Telecommunications, Inc., Minneapolis, Minn.

[21] Appl. No.: 192,071

[22] Filed: Feb. 4, 1994

Related U.S. Application Data

[63] Continuation-in-part of Ser. No. 898,791, Jun. 15, 1992, abandoned.

[51] Int. Cl.⁶ .................................................... H03L 7/07
[52] U.S. Cl. .................. 331/2; 331/14; 331/17; 331/25
[58] Field of Search .................... 331/2, 14, 17, 331/25

[56] References Cited

U.S. PATENT DOCUMENTS

| | | | |
|---|---|---|---|
| 4,282,493 | 8/1981 | Moreau | 331/2 |
| 4,450,518 | 5/1984 | Klee | 331/1 A |
| 4,864,253 | 9/1989 | Zwack | 331/1 A |

*Primary Examiner*—Siegfried H. Grimm
*Attorney, Agent, or Firm*—Schwegman, Lundberg & Woessner, P.A.

[57] ABSTRACT

A digitally controlled phase locked loop generates a derived clock signal that is frequency locked to a reference clock signal. The apparatus is comprised of a microcontroller, counter, digital to analog converter (DAC) and a voltage controlled crystal oscillator (VCXO) connected in a feedback loop arrangement. A frequency output derived from the VCXO periodically samples an incoming reference signal. The sampled count value is compared to an ideal count value associated with the same sampling time period. A microcontroller and software-based algorithm perform the phase comparison and loop filter operations of the phase locked loop (PLL).

14 Claims, 6 Drawing Sheets

PHASE LOCKED LOOP USING A COUNTER AND A MICROCONTROLLER TO PRODUCE VCXO CONTROL SIGNALS

This is a continuation-in-part of application Ser. No. 07/898,791, filed Jun. 15, 1992 and now abandoned.

FIELD OF THE INVENTION

This invention relates generally to the field of communication systems, and more specifically to a digitally controlled phase locked loop for generating a derived clock signal which is frequency locked to a reference clock signal.

BACKGROUND OF THE INVENTION

Communications systems require that the operation of synchronous transmission and switching equipment be coordinated. Generally, a communications network is comprised of many different pieces of synchronous electronic equipment, each having its own independent clock source. In order for the network to function properly and to ensure complete transmission of information over the network, these independent clocks must be synchronized to each other and traceable to a central frequency reference.

One well-known means of achieving clock synchronization is through use of a phase locked loop (PLL). The PLL is a frequency-selective circuit comprising a phase comparator, low pass filter and a voltage controlled oscillator (VCO) connected in a feedback arrangement. When an input or reference clock signal is applied to the PLL, the phase comparator compares the phase of the reference signal with the phase of the VCO output signal and generates an error voltage which is related to the phase difference between the two signals. This voltage is filtered, amplified, and applied to the VCO, thus forcing the frequency of the VCO output signal to vary in a direction which more closely approximates the reference signal frequency. When the VCO output frequency is sufficiently close to the reference frequency, the feedback nature of the PLL causes the VCO output to synchronize or "lock" to the reference signal frequency (with the exception of a finite phase difference). The self-correcting nature of the PLL thus allows the system to track the frequency changes of the reference signal once it is locked. At times, however, a valid reference signal is not available, as when the connection to the synchronization network is lost, or when the reference signal is in error. Nevertheless, the equipment that is tracking the reference signal is still obligated to send and receive information over the communications network even when a valid reference signal is not available. When this occurs in a typical phase locked loop implementation such as that described above, the VCO operates at its free-run frequency instead of at the frequency of the reference signal. This free-run frequency typically is not reliable enough to avoid jeopardizing the integrity of the data transfers.

Thus, there is a need in the art for a clock synchronization scheme which generates a derived clock signal from and which tracks a reference clock signal, which is able to reliably generate a clock signal that closely replicates the reference clock signal even when a valid reference clock signal is not available, and further which reduces the amount of jitter transmitted from the reference clock signal to the output clock signal.

SUMMARY OF THE INVENTION

To overcome these and other shortcomings and limitations in the art which will become apparent to those skilled in the art upon reading and understanding the following detailed description, the present invention provides a digitally controlled phase locked loop for generating a derived clock signal that is frequency locked to a reference clock signal. The apparatus is comprised of a microcontroller, counter, digital to analog converter (DAC) and a voltage controlled crystal oscillator (VCXO) connected in a feedback loop arrangement. The invention operates by using a frequency output derived from the VCXO to periodically sample an incoming reference from the network. This sampled count value is compared to an ideal count value associated with the same sampling time period. The invention uses a microcontroller and software-based algorithm to perform the phase comparison and loop filter operations of the phase locked loop (PLL). The output of the microcontroller operations is a digital output related to the frequency difference between the reference and the VCXO output. The DAC converts the digital output to an analog signal which forms the control voltage input to the VCXO. This control voltage causes the VCXO output frequency to vary in a direction which more closely approximates the reference signal frequency. The microcontroller stores digital representations of the control voltages over a certain period of time. The microcontroller also provides the ability to monitor the integrity of the reference signals to within predetermined limits. If no valid reference signal is available, the stored values corresponding to a frequency output which had formerly produced a locked condition can be reloaded into the DAC. In this manner, the VCXO output closely replicates the reference signal frequency even though no valid reference signal is available.

Use of a microcontroller to perform the phase comparator filtering and control functions of a phase locked loop has distinct advantages. First, the microcontroller is capable of selecting which of several inputs to use as the loop reference and simultaneously monitoring multiple inputs for frequency, stability and loss of signal.

Second, on most system units an intelligent device such as a microcontroller or microprocessor already exists. So use of that element for phase locked loop control eliminates discrete hardware formerly required for elements such as phase comparators and filtering. Use of a microcontroller also enables implementation of adaptive filtering techniques, whereby a separate algorithm is utilized for obtaining loop Capture, or pull in, and another for maintaining loop lock. In addition, because the microcontroller only updates the loop at discrete intervals, output signal jitter at a frequency greater than one-half the loop update rate is virtually eliminated. For example, a microcontroller which performs loop updates every 100 Hz will eliminate virtually all jitter above a frequency of 50 Hz. Also, during failure conditions it is straight forward for a microcontroller to stop updates to the VCXO and set the loop at its centerpoint for free run operation or to implement hold over operation. Finally, in systems which employ multiple phase lock loops, a microcontroller is able to coordinate phase alignment between all clock outputs.

BRIEF DESCRIPTION OF THE DRAWINGS

In the drawings, where like numerals refer to like elements throughout the several views.

DETAILED DESCRIPTION OF THE PREFERRED EMBODIMENT

In the following detailed description of the preferred embodiment, reference is made to the accompanying drawings which form a part hereof, and in which is shown by way of illustration a specific embodiment in which the invention may be practiced. This embodiment is described in sufficient detail to enable one skilled in the art to practice the invention. It will be understood that other embodiments may be utilized and that structural changes may be made without departing from the spirit and scope of the present invention. The following detailed description is, therefore, not to be taken in a limiting sense, and the scope of the invention is defined by the appended claims.

Figure 1:
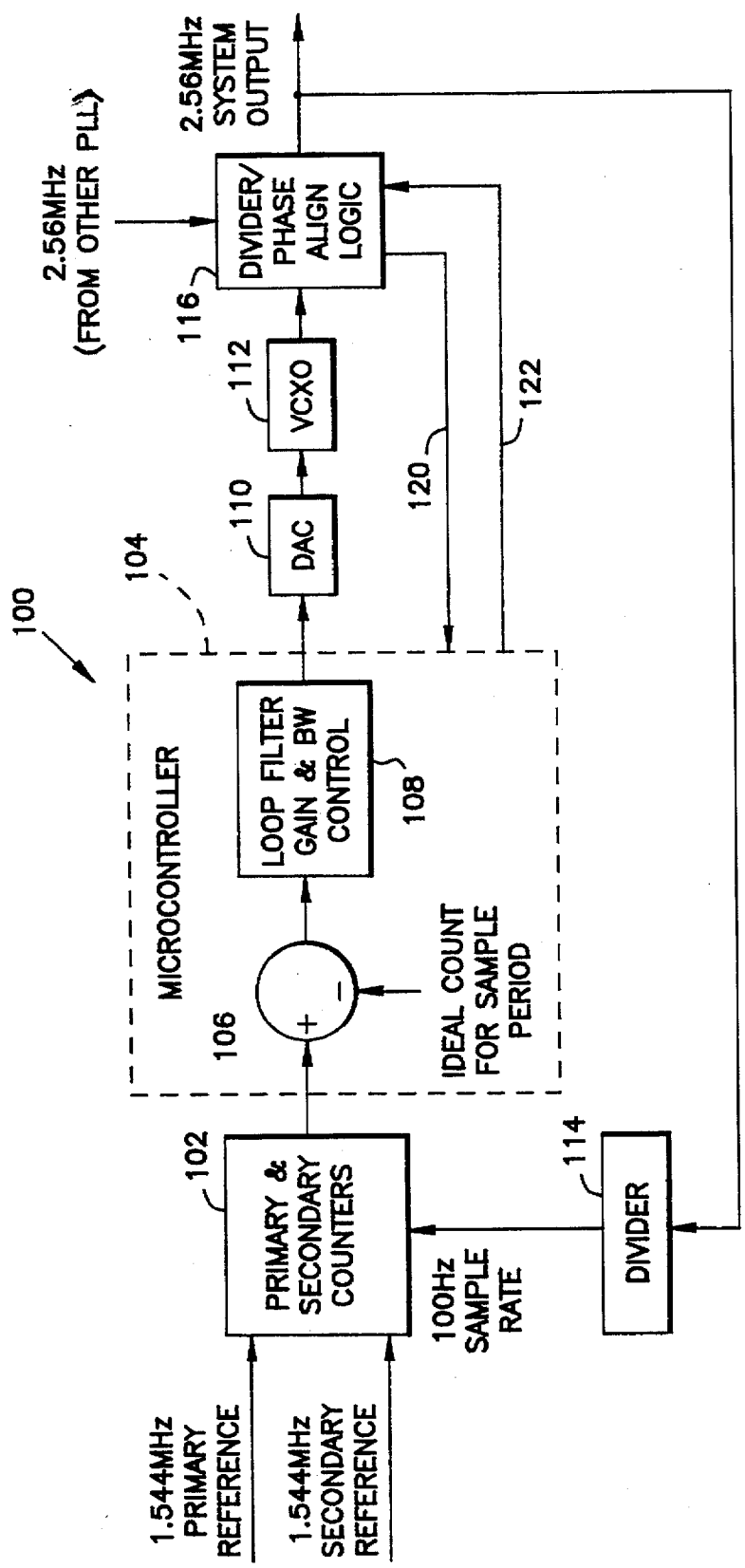
FIG. 1 shows a block diagram of the phase locked loop circuit of the present invention.

Referring now to FIG. 1, a block diagram of the phase locked loop ("PLL") 100 of the present invention is shown. The preferred embodiment of the present invention is designed to produce a stratum 4 clock signal for use in a stratum 4 piece of communications equipment. As those skilled in the art are aware, the term "stratum" refers to the standardized levels of accuracy for clock oscillators, wherein stratum 1 is defined to be of the highest accuracy and wherein stratum 4 is defined as having an accuracy of at least 32 parts per million.

The preferred embodiment of the present invention uses a stratum 3 clock signal as the reference clock signal to derive a stratum 4 clock signal output. The stratum 3 timing reference used in the preferred embodiment of the present invention is a recovered 1.544 MHz DS1 clock signal which is used to derive a 2.56 MHz output clock signal. When a valid DS1 reference is not available, the present invention is nevertheless capable of generating clock outputs with a stratum 4 accuracy of ±32 ppm. The PLL 100 of the present invention also attenuates jitter on the reference DS1 signal so that it is not transferred to the derived clock signal.

Although the preferred embodiment of the present invention will be described with reference to these above mentioned signals and frequencies, those skilled in art will readily recognize that the present invention need not be implemented with these particular reference and output signals and frequencies. Rather, the present invention could be used to derive a stratum 2 clock signal from a stratum 1 clock signal, among others. In fact, the present invention could be used with any combination of reference and output frequencies, signals, tolerances, etc. without departing from the spirit and scope of the present invention.

The primary inputs to the PLL 100 of the present invention are two 1.544 MHz DS1 reference clock signals. The 2.56 MHz based clock output of the PLL 100 is frequency locked to one of these reference inputs during normal operation. In the preferred embodiment of the present invention, two 1.544 MHz DS1 reference clock inputs are utilized. These two clock signals are referred to as the "primary" and "secondary" reference clock signals. Although only one of the reference signals is used to generate the derived output clock signal at any one time, the use of the second reference clock input is to provide protection in the event that the primary reference signal for some reason becomes invalid.

The primary and secondary references are each used to clock dedicated 16-bit counters 102. A pulse of approximately 100 Hz generated out of divider 114 as described below causes the contents of the reference counters to be latched into dedicated 16-bit registers which are addressable by microcontroller 104. Microcontroller 104 is, in the preferred embodiment of the present invention, also responsible for monitoring both DS1 reference signals for loss of activity, and for frequency stability. Microcontroller 104 is also therefore responsible for configuring whether the primary or secondary DS1 reference is used as the source for deriving the system output.

A control algorithm programmed in microcontroller 104 for adjusting the digital to analog converter (DAC) 110 controls the loop filter parameters of PLL 100 of the present invention. According to this algorithm the amount which microcontroller 104 updates DAC 110 determines the gain of the loop filter, and the rate at which microcontroller 104 updates DAC 110 determines the bandwidth of the loop filter.

DAC 110 provides the control voltage input to VCXO 112. In the preferred embodiment of the present invention, DAC 110 is a 12 bit DAC with readback latches. The input to DAC 110 represents the adjustment value which has been calculated by the PLL control algorithm of the present invention as a result of the frequency comparisons made between the reference clock signal and the output clock signal. Through this function, PLL 100 of the present invention is able to adjust and control the output frequency of VCXO 112.

The amplified control voltage output of DAC 110 drives VCXO 112. In the preferred embodiment of the present invention, a VCXO 112 is selected which operates at a center frequency of 20.48 MHz. As those skilled in the art will readily appreciate, the frequency of VCXO 112 need not be 20.48 MHz. Rather, the VCXO 112 center frequency was chosen for reasons of vendor availability and also the ability to divide this VCXO output frequency to obtain higher speed clock rates useful for other internal system processing. The higher speed VCXO primarily provides adjustment resolution required in divider/phase-alignment logic 116. A VCXO rate of 8 times the desired frequency output (2.56 MHz in the preferred embodiment) easily provides the ability to generate eight phases of the 2.56 MHz output, each separated by 45° as necessary for edge alignment of the output signals of the active and standby PLLs (as will be described herein below).

The output of VCXO 112 is the input to divider/phase-align logic 116, which produces the 2.56 MHz clock output of PLL 100. The purpose of divider/phase-align logic 116 is to step down the frequency of the 20.48 MHz VCXO output to the 2.56 MHz derived clock signal, and also to generate multiple phases of the 2.56 MHz clock when the present invention is set up in its preferred configuration, with an "active" PLL and a second "standby" or backup PLL (this configuration is shown and described with respect to FIG. 3). The presence of a standby PLL provides protection in the event that the active PLL fails.

Referring again to FIG. 1, the 2.56 MHz output of PLL 100 of the present invention is the input to divider 114, which in the preferred embodiment of the present invention implements a divide by 25,600 function to produce a signal having a frequency of approximately 100 Hz. The 100 Hz signal is used to assert an interrupt to microcontroller 104, and latch the outputs of the DS1 reference counters 102. This 10 msec signal, therefore, essentially provides a sampling rate of the input DS1 reference frequency. These sample results provide the frequency comparison data which microcontroller 104 uses to drive DAC 110 and VCX0 112 toward the frequency of the selected DS1 reference. Essentially, the number of transitions of the 1.544 MHz reference are counted and sampled at the rate derived from the VCXO output. This count value is compared in microcontroller 104 with an ideal count value which should be 15440 transitions if the VCXO output is operating at the correct frequency to result in a 10 msec sample rate, which is expected if the VCXO output is locked to the reference signal. The differences are then accumulated in microcontroller 104 to produce the adjustment input to DAC 110 according to a PLL loop filter control algorithm.

PLL Operation

In addition to an initialization state which is required for all software, the PLL has four primary states of operation:

1) CAPTURE (includes PLL gain calibration)
2) NORMAL
3) FREE-RUN
4) HOLD-OVER

Figure 5:
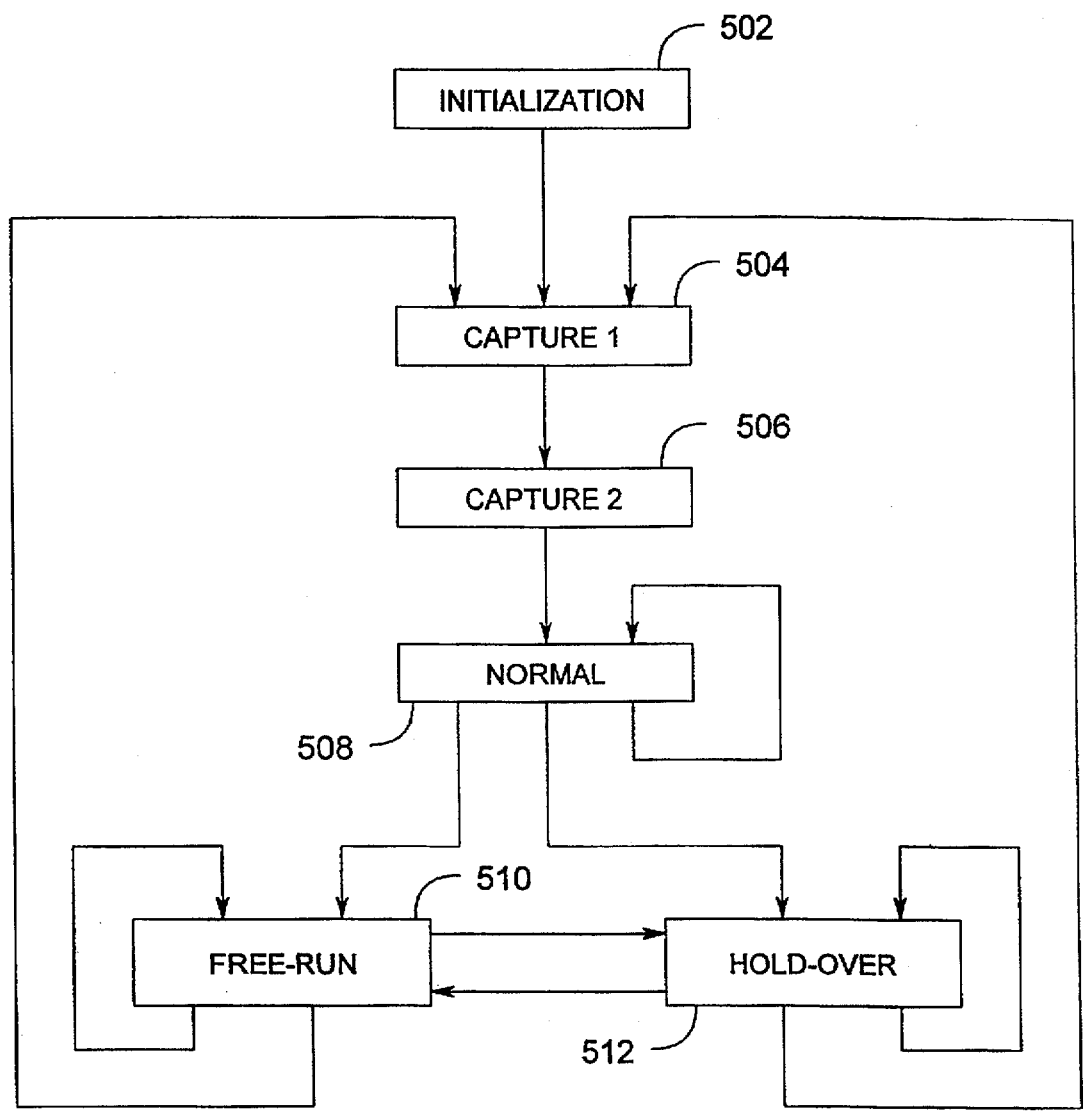
FIG. 5 shows the operating states of the phase locked loop (PLL) of FIG. 1.

This is represented by the state machine illustrated in FIG. 5 (implemented in firmware running on the microcontroller). Five states are defined in this implementation:

1. INITIALIZATION (502): This state represents the entry point into the PLL algorithm, and the initialization state for all variables and data structures. This normally corresponds to the power-up state where all loop parameters are assigned default values.

2. CAPTURE (504–506): Capture represents a specialized high-gain, slower update (lower bandwidth) algorithm. The goal of this state is to quickly approximate the frequency of the reference within 1 Hz, and to calibrate the loop gain coefficients used during PLL NORMAL operation. The CAPTURE state is executed twice following PLL initialization, with a PLL loop gain calibration occurring prior to the second execution of CAPTURE. Completion of the second CAPTURE state causes a transition to the NORMAL mode of PLL operation.

3. NORMAL (508): Normal Operation represents a lower-gain, faster update (higher bandwidth) correction algorithm implemented by PLL firmware (represented by FIG. 2) following the initial estimation performed by CAPTURE execution. Normal operation represents the algorithm which maintains the PLL output clock in lock.

4. FREE-RUN (510): Operation condition where the local oscillators of the module are not locked to an external synchronization reference, and no storage techniques are being used to sustain clock accuracy. The local oscillators are programmed by the microcontroller 104 to a default setting (normally the center frequency of the oscillator). This is normally done during times of reference failure when no valid past history is available to approximate the output frequency of the clock.

5. HOLD-OVER (512): Operation condition in which the local oscillators of the module are not locked to an external reference, but are using storage techniques to maintain clock accuracy with respect to the last known frequency comparison with a valid external reference. Due to the microcontroller based implementation of the PLL, it is straight-forward for the module to calculate and store a running average value which represents oscillator output frequency's best estimate of the reference input. Hold-over is used during times of reference failure or degradation when a valid past history is available to approximate the output oscillator frequency.

Fast-Capture Implementation

In PLL timing applications, it is beneficial to have a system which is able to compensate for large differences between a reference input and the system output when initially trying to attain "lock" or "capture" on the incoming reference. However, during normal operation it is NOT desirable for a PLL to react too quickly or with too much correction to large perturbations in the input reference. Instead, the PLL should accurately track small changes in the reference once the reference frequency has been approximated. To reduce jitter in PLL outputs, normal PLL operation is designed to react slowly to large and/or rapid changes in the input reference. A microcontroller-based PLL allows the advantage of altering the bandwidth and gain characteristics of the loop for these two opposing goals.

A problem inherent in microcontroller-based PLLs is the need for the software/firmware to know within a certain tolerance the gain of the discrete components (D/A Converter, Op-Amp, VCXO) used in the loop. Of particular problem, VCXOs can possess a wide variation in gain characteristics, and tighter tolerance parts result in increased implementation costs. If a microcontroller-based PLL implements fixed constants in its PLL algorithms (a common, straight-forward approach), VCXO variation alone can severely affect PLL performance. Inability of the PLL to compensate for variations in loop gain will result in degraded loop performance. A low PLL gain will result in the PLL algorithm not compensating enough for changes it sees in the loop (overdamped response and poor tracking). A high PLL gain will result in the PLL algorithm overcompensating for errors it sees from the loop's phase detector (underdamped response and increased wander/jitter). Thus, loop response may be overdamped or underdamped if the pre-programmed constants chosen for the PLL algorithm do not match the gain of the actual discrete components present in the loop. To compensate for this, the firmware performs a "gain calibration" in conjunction with the CAPTURE portion of the PLL state machine. This allows the firmware to essentially "learn" the gain characteristics of the loop following initialization.

The Capture state of the PLL utilizes the following principles to accomplish the above goals:

1. One second represents the minimum amount of time the microcontroller 104 must collect data to estimate a reference within ±1 Hz. If the reference input counts accumulated over a one second period are compared with the ideal number of counts expected by the PLL over that period (1544000 in our case), the error represents the frequency difference in Hz between the PLL output and the reference input (±1 Hz). For example, if the firmware collects 1544003 counts over the first second, this implies the PLL output is actually about 3 Hz slower than the incoming reference. If a correction is applied to the PLL which is representative of the frequency error measured, the PLL can quickly approximate the frequency of the reference. This requires accurate knowledge of the gain factor (#of DAC bits which produce a 1 Hz change in the PLL output). The DAC 110 will be updated with a value proportional to 3 Hz to capture the reference. This process represents the CAPTURE 1 state.

2. After performing an update following one second of measurements, the PLL can collect a second one-second total of error count information. If the gain factor used by the PLL firmware to approximate the frequency difference present in the loop is accurate, the second one-second period should yield an error count of −1, 0, or +1 (implying the PLL is within 1 Hz of the reference). If there is still a significant difference between the first estimation, this implies that the gain used in the initial estimation is not accurate. The PLL firmware then uses the magnitude of the remaining difference and the initial value for the gain factor to re-calculate a new gain factor for the system. This process represents the CAPTURE 2 state.

The CAPTURE process of the PLL implements the following basic steps:

1. STEP#1: With the PLL set to its free-run (theoretical center) frequency, firmware initializes one-second counters and sets loop gain coefficients to a default value.
2. STEP#2: After collecting one second of reference counts, the firmware compares this count total to the ideal total expected over a one second measurement period (1544000 in the case of a 1.544 Mhz reference input). This is an accurate representation of the difference in Hz between the input reference and the PLL output. The delta between the two totals is then multiplied by the default loop gain (#bits/Hz) and written to the DAC 110 to adjust the output of the VCXO 112 to match that of the reference input. The value written to the DAC 110 corresponds to the following:

initial_frequency+(error_1sec * loop_gain)

where
"initial_frequency" is the value that firmware initially programs the DAC 110 to in Step 1. Following initialization, this value is the theoretical value which will set the output of the VCXO 112 to the center frequency.
"error_1 sec" represents the normalized error counts collected over the first one second of PLL operation (CAPTURE 1). In one example application, it is defined by the following:
error_1 sec=(actual # of counts accumulated over 1 sec)−(ideal # of counts: 1544000)
"loop_gain" is the gain of the loop expressed in # of DAC bits which produce a 1 Hz change in the PLL output. "loop_gain" is assigned a default value following initialization which corresponds to the free run setting.

Any invocation of the CAPTURE state which does not follow initialization uses the existing loop gain to adjust the DAC (i.e. the algorithm does not reset loop gain to the default setting).

3. STEP#3: If the loop gain is an accurate estimate of the actual gain of the loop, this initial correction will drive the VCXO 112 output to within ±1 Hz of the reference input. To confirm this, the PLL firmware collects another second of reference counts and compares this total to that of the ideal count. If the error is small (−1, 0 or +1 counts), the default loop gain is assumed an accurate approximate and no change is made to the gain coefficients.
4. STEP#4: If the error is larger than 1 count, the loop gain may be recalculated from parameters firmware has already measured.

Loop Gain (in bits/Hz)=|error_1 sec_1 * loop gain|/|error_1 sec_1 −error_1 sec_2| where the following parameters are defined:
error_1 sec_1=normalized error count total for 1st second of measurement (CAPTURE 1).
error_1 sec_2=normalized error count total for 2nd second of measurement following initial estimate (CAPTURE 2).
loop_gain=initial value for loop gain; expressed as a quantity indicating the # of DAC bits which represent a 1 Hz change in the PLL output.

NOTE: If the initial error observed for the first second (error_1 sec_1) is zero, the PLL output already approximates the reference and no loop gain measurements are possible. The higher the value for error_1 sec_1, the greater the resolution of the gain calculation. This can be ensured by setting the initial loop frequency to a value substantially offset from the center frequency. If the initial loop correction (see Step#2) provides no improvement in the PLL error response (error_1 sec_1=error_1 sec_2), gain calibration is not possible. This indicates a loop gain which far exceeds the acceptable tolerance and may be used as an indication that faulty hardware exists in the loop. With proper initial values chosen for the DAC setting and the default loop gain, this condition should be avoidable.

5. STEP#5: Following completion of the two-second CAPTURE algorithm, PLL firmware has an accurate gauge of the loop gain characteristics and a good estimation of the reference input. The loop then switches to the NORMAL state of operation and uses update coefficients based on the calibrated gain to track the incoming reference frequency and changes.

This "CAPTURE" algorithm allows a software/firmware-based PLL to approximate the frequency of a reference input within 1 Hz within a maximum time of 2 seconds, and the ability to calibrate the actual gain characteristics of the PLL.

PLL Control Flow

Figure 2:
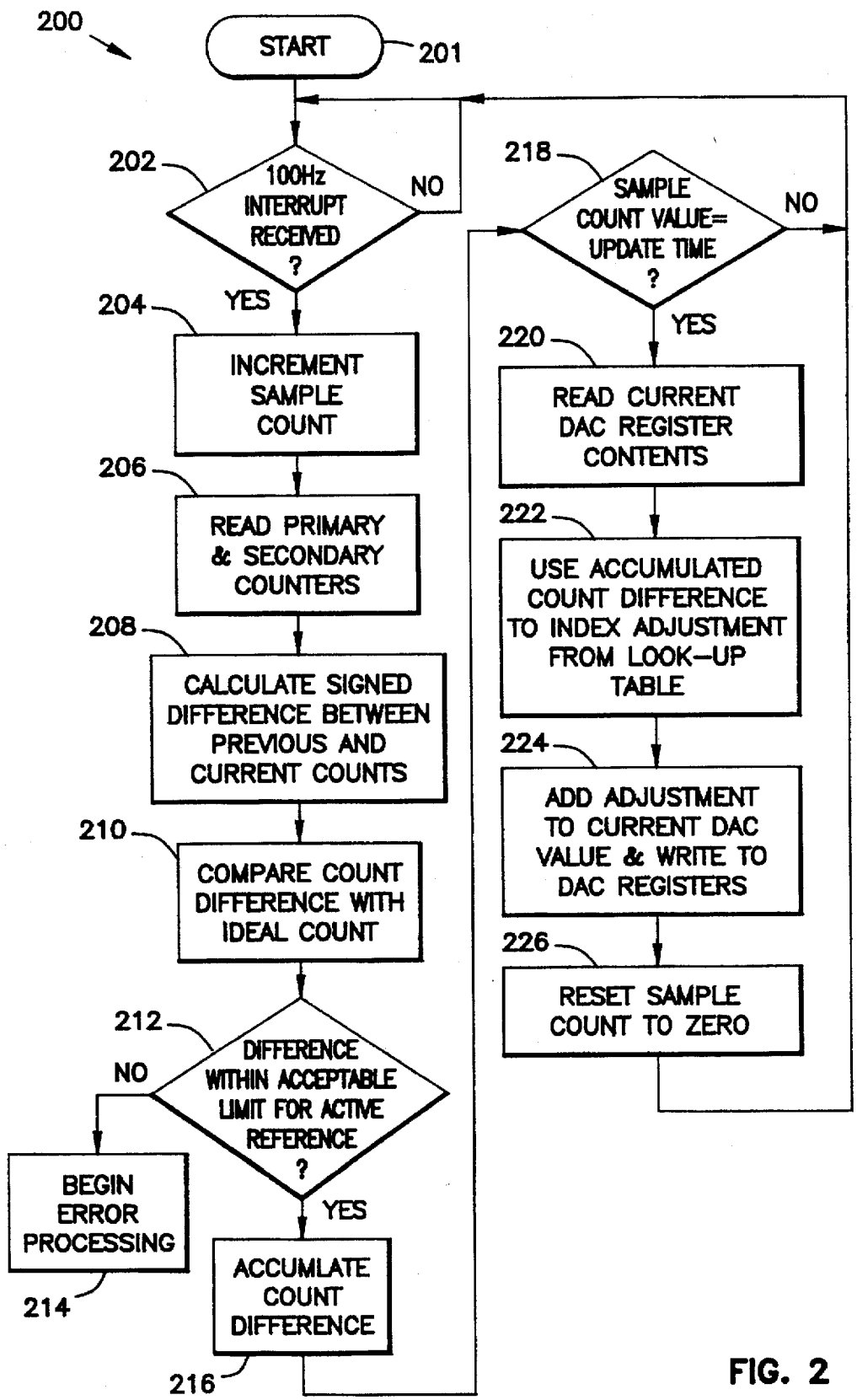
FIG. 2 shows the control flow through the phase locked loop of the present invention.

FIG. 2 shows a flowchart 200 of the control flow through the PLL of the present invention in its NORMAL mode of operation. Using the proper initial values chosen for the DAC setting and the default loop gain obtained in the CAPTURE state, at decision box 202, the output of the divider 114 is continually polled for the occurrence of the 100 Hz sampling/interrupt signal. Alternatively, at start oval 201, the VCXO control voltage is set to 2.5 Vdc in, such that the VCXO output is operating within +/− 25 ppm of its center frequency. This fixes the sampling rate at 100 Hz +/− 25 ppm (10 msec=/−250 nsec.).

Upon occurrence of the 100 Hz signal, the sample count is updated to keep track of the DAC update interval. Both the primary and secondary reference counters 102 are polled at control box 206. Although only the registers which represent the primary clock reference are used to drive the PLL of the present invention, the second reference registers are monitored to ensure signal integrity.

At control box 208, the value of the current count is compared to a stored value of the previous count and a signed difference is calculated. When the PLL output of the present invention is locked to the frequency of the reference signal, this difference between the previous and current counter values will always be 15,440 every 10 msec (1.544 MHz×10 msec=15,440 counts). In this respect, it is critical that the reference counters are not cleared or reset during any measurement period. Resetting the reference counters on a periodic basis destroys the ability to discern small frequency deviations between the DS1 reference input and the PLL output with any resolution.

Next, at control box 210 the calculated difference count is compared to the ideal 10 msec count of 15,440. The integrity of the primary reference and VCXO signals are monitored at decision box 212 by determining whether the count difference is within acceptable limits. If the count value indicates that the integrity of either of these signals is lacking, error processing (not described) can be initiated at box 214.

If there are no signal quality problems the present count value is stored for use in calculating the next 10 msec difference count, the count deviation from the ideal count of 15,440, and whether this deviation is greater than 15,440 or less than 15,440. The previous count value obtained from the last 10 msec interrupt may be overwritten at this point. Approximately every 10 msec the number of count deviations are accumulated by microcontroller 104.

After a specified number of sample counts, the count deviation is analyzed, and the DAC output is adjusted accordingly to force the VCXO to track the reference input frequency more closely. In the preferred embodiment of the present invention, the specified time period at which updates to the DAC are made are in increments of 10 msec. Because the preferred embodiment of the present invention uses only the present and previous count value to determine the DAC adjustment, the algorithm described herein with respect to the preferred embodiment of the present invention approximates a first-order response. Decision box 218 determines whether the number of 10 msec sample intervals has reached the DAC update interval time. If not, the count differences continue to be calculated and accumulated through the loop comprised of boxes 202–216.

In the preferred embodiment of the present invention, each change of 1 LSB in the DAC control alters the control voltage seen at the VCXO input by approximately ±1.2 millivolts.

If the VCXO output frequency is too low, the difference count observed will be greater than 15,440, because the "sampling" period out of divider 114 will actually be greater than 10 msec. In this case, the VCXO frequency will be increased in order to more closely match the long-term frequency average of the DS1 input reference.

If the VCXO output frequency is too high, the difference counts observed will be less than 15,440, because the "sampling" period out of divider 114 will actually be less than 10 msec. In this case, the VCXO frequency will be lowered in order to more closely match the long-term average of the DS1 input reference.

The control flow through the PLL is sequentially repeated until the VCXO output frequency matches the long-term frequency average of the DS1 reference input. Once the PLL clock of the present invention has obtained a locked condition, the process continues as needed to maintain lock.

Free-Run Mode and Holdover Mode Operation

When PLL 100 of the present invention is unable to obtain lock, or when both the primary and secondary DS1 references are not within the required ±32 ppm tolerance, the PLL of the present invention is able to operate in either a free-run mode or a holdover mode of operation.

The use of microcontroller 104 in the PLL loop filter of the present invention enables operation of the PLL of the present invention in holdover mode. Holdover mode operates through use of storage techniques and past loop history to maintain loop lock and clock stability. According to the preferred embodiment of the present invention, microcontroller 104 stores the 12-bit DAC adjustment values over a specified period of time. If the PLL has previously been in lock at some past time, the sequence of stored adjustment values corresponding to a frequency output which had formerly produced a "lock" condition can be repeatedly reloaded into DAC 110. In this way, the PLL of the present invention uses data observed from recent past history to make a best guess estimate of the desired output frequency of VCXO 112. Preferably, in the present invention the Hold-Over value represents an average of the update values written to the DAC 110 of the PLL over the past second. This average time period may be increased or shortened based upon the particular application.

If no recent history is available, the PLL of the present invention operates in its Free Run mode. In free run mode, DAC 110 is set to produce a VCXO control voltage which drives the VCXO output to its center frequency. The center frequency of VCXO 112 should produce a system, clock output of 2.56 MHz ±25 ppm in the preferred embodiment of the present invention.

Dither in PLL Algorithm

Any Phase Locked Loop or feedback system requires an error to operate correctly. In a conventional PLL, the output of the phase comparator is a continuous, analog voltage which is directly proportional to any fraction of phase variation from −360 degrees to +360 degrees. An analog phase detector in a conventional PLL enables a PLL to react almost immediately to any disturbances in the loop.

In the microcontroller-based PLL of the present invention, the edge-based phase detector implemented by the discrete reference counters and firmware is only capable of a digital output, indicating the number of "counts" the firmware has detected over the last observation and update period. This represents a phase detector which can only detect integer multiples of +360 degrees or error. Thus, the correction algorithm of the PLL has no information with which to control the DAC 110 and PLL unless it sees error counts. A microcontroller-based PLL does not see fractional phase variations with a digital phase comparator implementation. In addition, unless the microcontroller is dedicated to the single function of servicing the Phase Locked Loop, the microcontroller may not immediately be able to respond to an error detected in the loop. These limitations in the phase detection capabilities of the microcontroller-based solution imply that the PLL algorithm may react too late or with too little correction to maintain a locked phase relationship between the PLL output and the input reference. The result is periodic cycle "slips" which may occur in the PLL output.

In particular, a microcontroller algorithm may detect an error in normal operation of a PLL, via the accumulated counts in the reference counter. The microcontroller adjusts the DAC 110 to attempt to correct for that error. Following this correction, the PLL output may actually increase the phase error due to temperature and/or voltage drift in the VCXO 112, such that the initial adjustment provided by the microcontroller 104 to the DAC 110 is not adequate. Unfortunately, the microcontroller is unaware of the fact it has not compensated for the loop error until a cycle slip actually occurs and an error count is detected.

Figure 6:
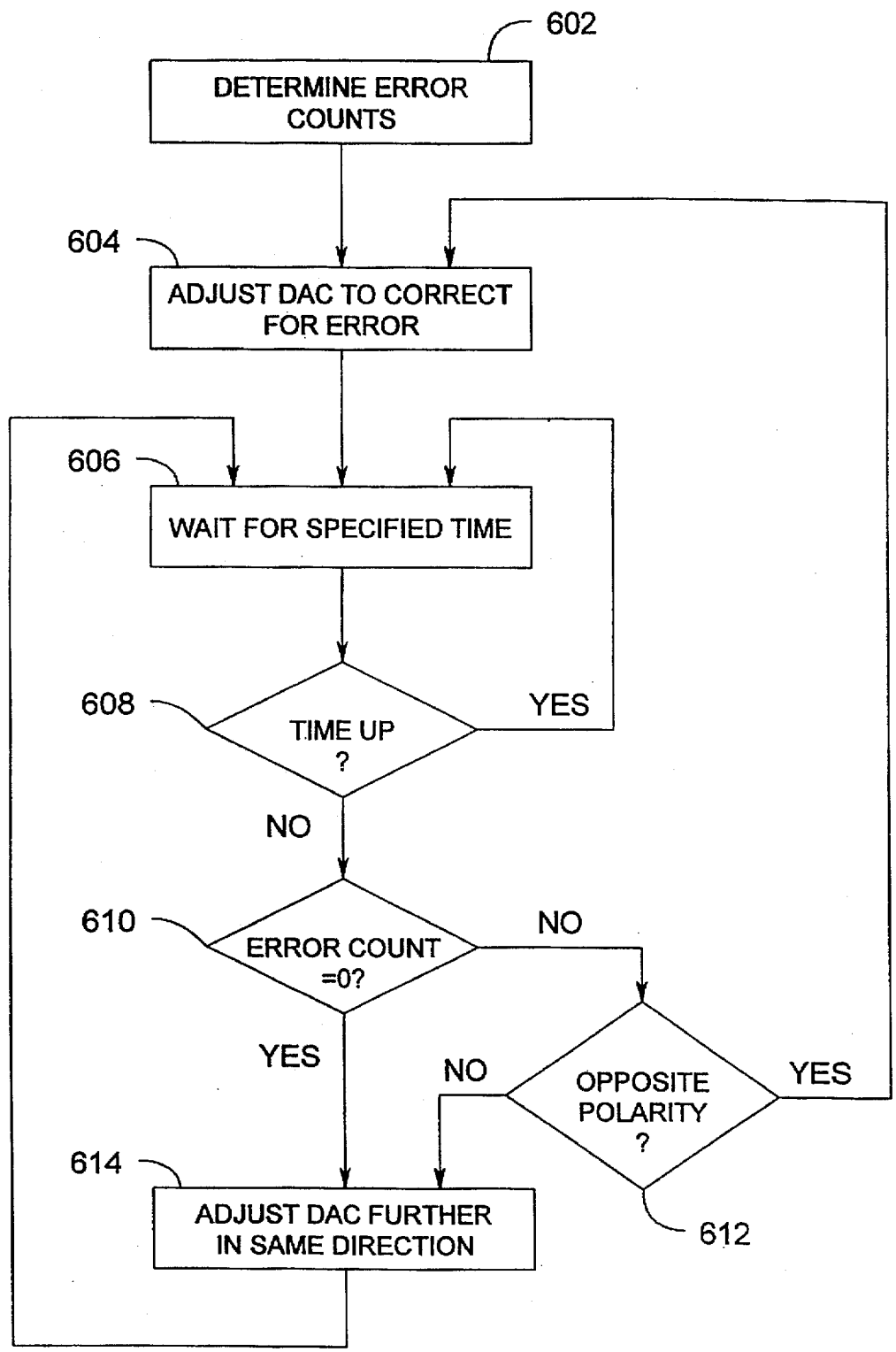
FIG. 6 shows a flow chart of a "dither" type algorithm used in the PLL firmware.

To correct this problem, PLL firmware implements a "dither" type algorithm as illustrated in FIG. 6 (preferably executed within the NORMAL mode of operation illustrated in FIGS. 2) which essentially forces an additional correction in the direction of the last update if the last update has not resulted in an error count after a specified period of time. Following an update to DAC 110 (602–604) of the PLL, the microcontroller starts a timer in firmware. If this correction update does not result within a specified time in the detection of an error count of the opposite polarity as the last error, the firmware will force an additional correction of the same polarity (but lesser magnitude) as the last update. This represents the case where the original update written to DAC 110 has not been able to compensate sufficiently for the observed error and an additional compensation is required (FIG. 6, 606–614).

Thus, the PLL output always has a "dither" characteristic which is observable in its output. This is characterized by the PLL outputs moving slowly back and forth around an error count detection point.

PLL Module Protection Switching

In most modern telecommunications systems, the clock recovery, PLL functionality, and system timing generation represent critical functionality to the operation of the system. For reasons of increased system reliability, it is desirable to implement redundant clock modules in most systems. One of these clock modules is normally designated the "active" module; the other is designated as the "standby" module. If a failure occurs which is isolated to the "active" module, it is necessary to perform a module protection switch and enable the "standby" clock module as the active clock logic. It is also common during times of no failures to routinely execute a protection switch to the standby module to verify the functional integrity of the standby module. Clock modules normally are responsible for generating a data transfer clock, which typically has a rate equal to or higher than the rate of data transfer used within the system. In conjunction with this, telecommunications clock modules are normally responsible for generating some sort of lower-rate, system frame clock which indicates the start of data times in the system transfer (since telecommunication applications use frame transmission). In standard telecomm applications, the data transfer clock is a 1.544 Mhz rate and the frame clock is 8 Khz. In the present invention, two data transfer rates are generated (1.544 Mhz and 2.56 Mhz), along with one frame clock (8 Khz) and an optical multiframe clock (100 Hz). A clock module protection switch will normally produce data errors in system transmission unless all clock outputs of both the active and standby modules are both frequency and phase synchronized together.

Synchronization of active and standby clock modules (and thus, their associated PLL circuits) in any system is not necessarily a straightforward process, especially in a microprocessor-based PLL implementation. In the standard application, both active and standby PLLs should be synchronized to the same reference which is derived from a network timing source. In this case, all outputs of both PLLs should be frequency synchronous—but are not aligned in phase. According to one aspect of the invention, the following procedure is provided for protection switching between an active and a standby module:

1. The microprocessor on the Standby PLL stops all updates to the DAC of the PLL and transitions to the Hold-over mode of operation. The microprocessor does this by writing the DAC registers with a value which approximates the average frequency of the incoming reference for the last one second of observation. This value corresponds to the Hold-over frequency for the present invention.

Attempting to maintain the PLL operating normally while phase alignment is actively performed is not recommended. During the NORMAL mode of PLL operation, the microcontroller-based PLL is attempting to lock its outputs to an input timing reference. During the Phase Alignment process, the microcontroller-based PLL is attempting to manually adjust the phase relationship of its outputs to those of another PLL. This results in an unstable condition in the standby PLL, especially when jitter is present in the input timing reference. The present invention preferably implements the more stable approach where the NORMAL mode of PLL operation is briefly "suspended" during a protection switch and phase alignment period. Following completion of the protection switch, NORMAL mode of operation is resumed.

2. Phase Alignment is performed via the process described below. This phase aligns the outputs of the data transfer clocks of the Standby PLL within 22.5 degrees of those of the Active PLL. It does not align the clock outputs on a frame or multiframe level.

3. To perform frame or multiframe alignment, the corresponding frame or multiframe signal from the active module is passed to the standby module and is enabled on the standby module to reset the state machines and counter/dividers of the Standby PLL.

4. Once the standby module has been synchronized by the frame or multiframe pulse from the active module, the standby microcontroller disables the synchronization pulse such that no further synchronization resets can occur. At this point, the outputs of the Standby PLL should be phase aligned to those of the Active PLL at a flame or multiframe boundary.

5. With phase alignment completed, the present invention switches the standby PLL to the active state at a time period corresponding to ¼ of a data transfer bit period immediately following a frame or multiframe boundary. The one-fourth bit period allows the protection switch to occur during an interval between significant instants of the data transfer clock. This avoids possible timing glitches.

6. Immediately following completion of the protection switch, the PLL of the now-active module is restored from HOLD-OVER to NORMAL mode of operation by the local microcontroller.

In summary, during typical operation the two dock modules of a telecommunication system will operate independently—each synchronizing to a common input reference but independently deriving their own unique phase relationship with respect to the input and their own unique frame/multiframe boundaries. Thus, the clock outputs of the two modules should be frequency synchronous—but not phase aligned. It is normally not necessary to keep the two modules phase aligned except at the time of a protection switch. During a protection switch, the Standby PLL is placed into HOLD-OVER mode and phase aligned with the Active PLL until the protection switch is completed. Following completion, the PLL is placed back in NORMAL mode of operation. In this way, it is possible to execute a protection switch between two clock modules in a system, even in the presence of significant jitter on the reference input.

Phase-Align Logic the firmware only needs to perform clock output phase alignment if the PLL is designated as the "Standby" PLL by the software. The protection procedure described in the previous section performs a phase alignment algorithm, as described below.

Figure 3:
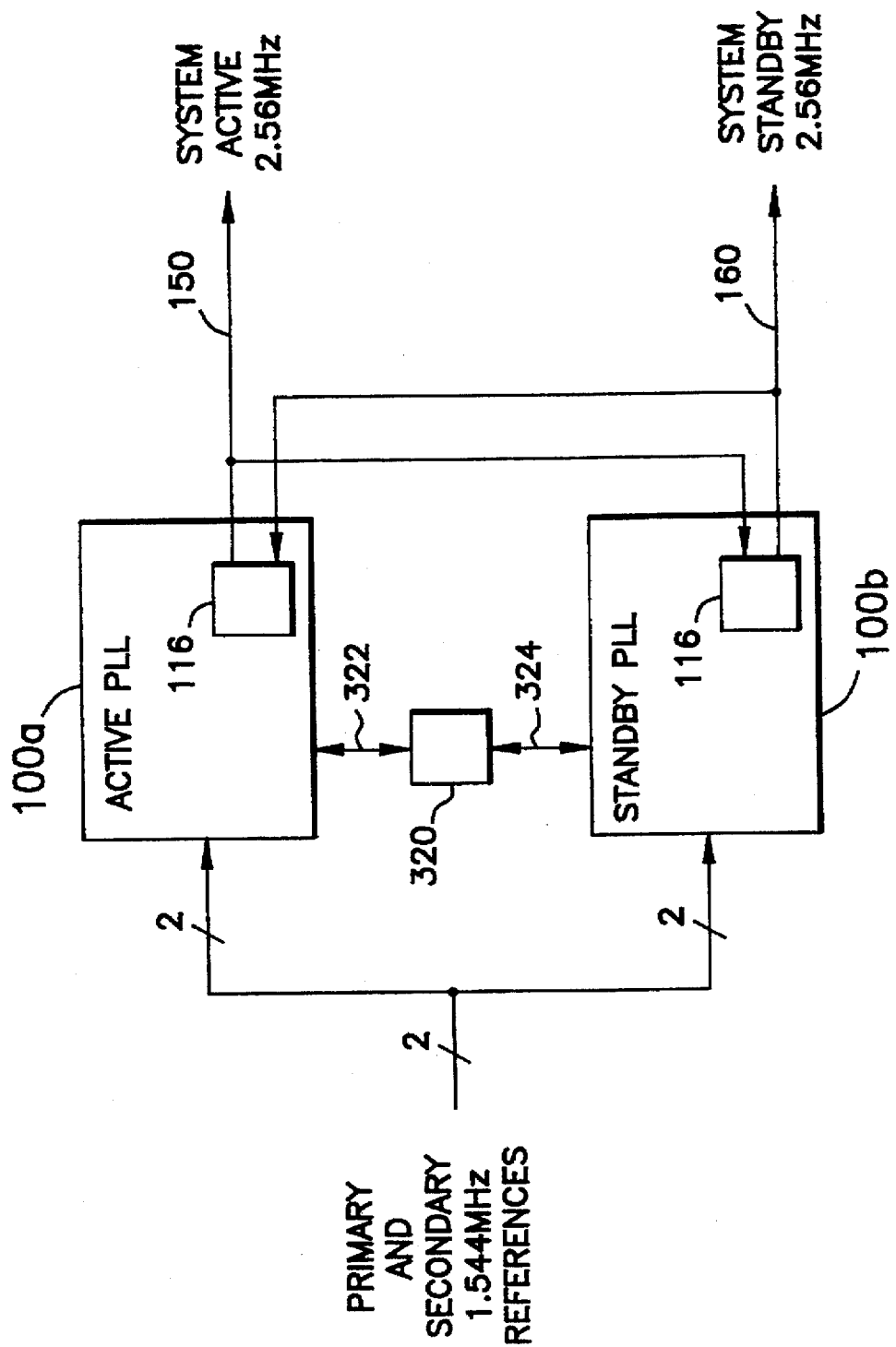
FIG. 3 shows a block diagram of the preferred embodiment of the present invention wherein an active and a standby PLL are connected in an equipment protect configuration.

The manner in which the present invention accomplishes the phase-alignment of the active and standby PLLs will now be explained. FIG. 3 shows a block diagram of two PLLs of the present invention, PLL 100a and PLL 100b, connected in the preferred protection configuration. Each PLL 100a and 100b is of the same type as that shown in FIG. 1.

Note that the concept of phase-alignment between two phase locked loops only makes sense in an environment where both phase locked loops are already frequency locked to a common reference. In the implementation of the present invention, this common reference is either the primary or secondary references shown in FIGS. 1 and 3.

Those skilled in the art will readily recognize that the outputs of the standby PLL must be phase-aligned within a given tolerance of those of the active PLL for "hitless switching" between the two PLLs. "Hitless switching" implies no errors in system data transfer when equipment is routinely switched from the active PLL to the standby PLL. Microcontroller 104 is responsible for selecting the correctly phased 2.56 MHz standby signal which most closely phase-aligns the outputs of the standby PLL to the clock outputs of the active PLL. This ensures that in the preferred embodiment of the present invention all system clocks are edge-aligned within a specific tolerance at one point every 125 microseconds.

In the preferred embodiment of the present invention, the standby PLL is programmed to adjust its phase output to edge-align to within a predetermined tolerance to the active PLL output. The active PLL software is programmed to ignore the phase input information. This is also the case if only one PLL is used, e.g., when the present invention is set up in a no protection configuration.

As shown in FIG. 3, each 2.56 MHz output from PLLs 100a and 100b is input to divider/phase-align logic 116 of the other PLL. The purpose of divider/phase-align logic 116 is to step down the frequency of the 20.48 MHz VCXO output to the 2.56 MHz derived clock signal, and also to generate multiple phases of the 2.56 MHz clock.

Figure 4:
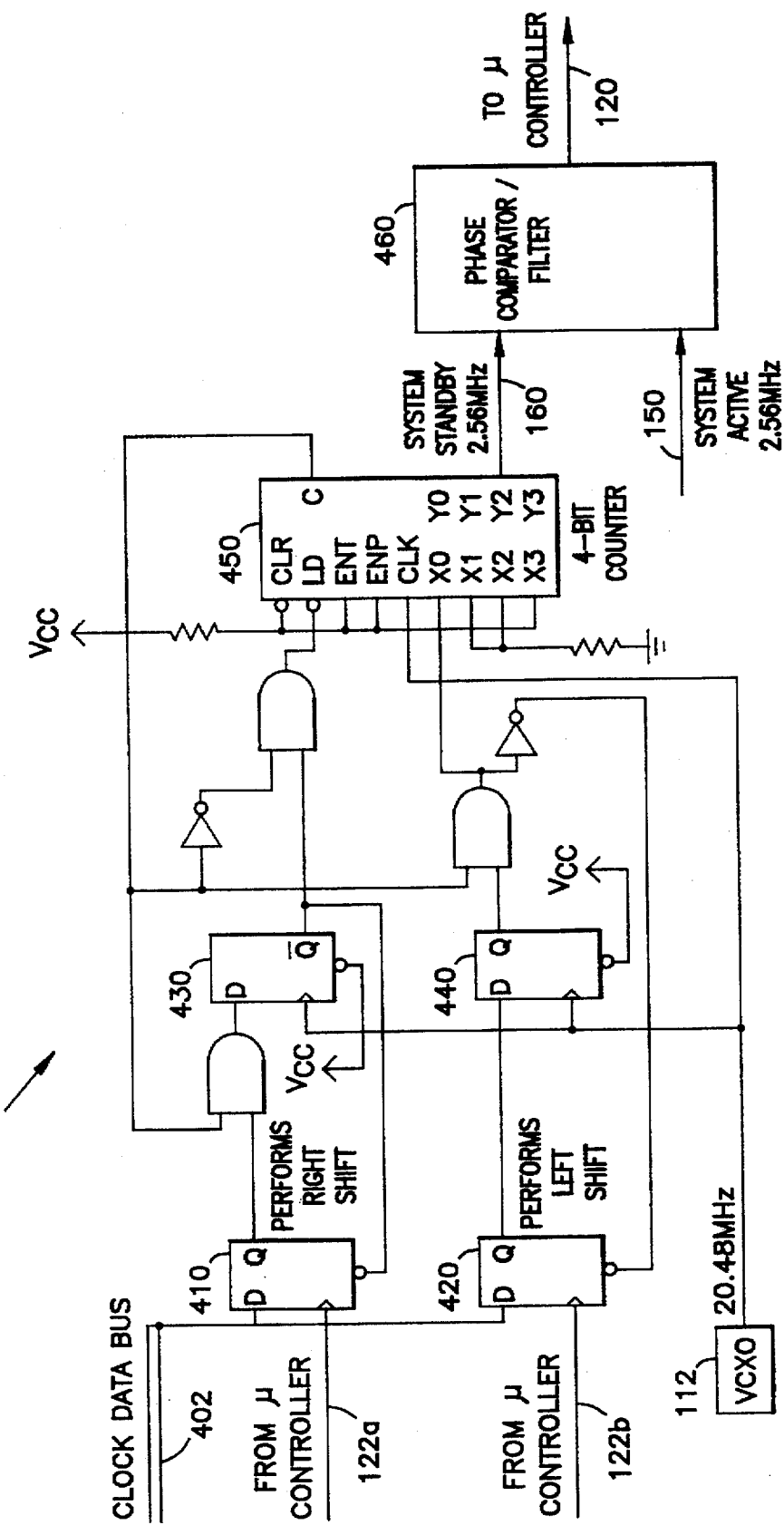
FIG. 4 shows a more detailed block diagram of divider/ phase align logic 116 for implementing the phase or edge-alignment of the standby PLL output to the active PLL output.

To accomplish the phase-alignment between the active and standby PLL outputs, phase-alignment logic 116 as shown in FIG. 4, contains an edge-based digital phase comparator and a state machine able to produce eight distinct phases of the 2.56 MHz clock outputs, each separated by 45°. Microcontroller 104 has control over which of the eight phases is selected as the final 2.56 MHz output clock signal. The microcontroller 104 performs adjustments by incrementing or decrementing the phase of the standby PLL output in intervals of 45° with respect to the active PLL output. This allows the standby PLL to be aligned within 22.5° of the active PLL output.

FIG. 4 shows a detailed block diagram of divider phase-align logic 116. As shown in FIG. 4, the system standby and the system active 2.56 MHz signals are both passed through an edged-based, digital phase comparator 460, which produces an error output. The resulting digital output is then processed through a passive filter to produce a constant analog output. This analog output is proportional to the phase difference between the rising edges of both 2.56 MHz signals.

This analog output is connected via line 120 to an A–D converter port on microcontroller 104 (In the preferred embodiment, microcontroller 104 is a Motorola HC11 microcontroller having an A/D converter and A/D port on chip) which converts the analog voltage to an 8-bit binary value. This value is used by microcontroller 104 to determine which direction the phase of the 2.56 MHz standby signal should be shifted to produce a phase difference between the active and standby clock signals that is closest to 0° and to generate the necessary control signals for accomplishing the phase shift.

Clock data bus 402 is in the preferred embodiment an 8-bit bus containing clock control signals. One of these bits is designated as the phase shift bit, and indicates when a phase shift of the 2.56 MHz standby signal is required to phase-align the standby signal to the active signal. This bit is input to latches 410 and 420.

The 2.56 MHz standby output is generated at output $y_2$ (output bit of 3rd order significance) of a 4-bit counter 450. In the preferred embodiment of the present invention, counter 450 is an AC 163 counter available from Intel Corp. Counter 450 is clocked by the 20.48 MHz VCXO output, thus allowing 8 distinct phases of the 2.56 MHz output to be produced, each separated by 45°.

Under normal operation, counter 450 loads an initial value of 8 (binary 1000) and counts to 15 (binary 1111) on 8 consecutive rising edges of the 20.48 MHz clock.

If the phase of the 2.56 MHz standby signal should be shifted right by 45 (e.g., 49 ns, or one clock period of the 20.48 MHz VCXO output) microcontroller 104 generates a control signal on line 122a to clock latch 410. This causes the binary value of 1000 to be loaded on two consecutive cycles of the 20.48 MHz clock, inserting an extra 20.48 MHz cycles into the output and shifting the 2.56 MHz output right by 49 nanoseconds. Similarly, if the phase of the 2.56 MHz standby signal should be shifted left by 45, microcontroller 104 generates a control signal on line 122b to clock latch 420. This causes the binary value of 1001 to be loaded for one occurrence, instead of the normal load value of binary 1000. This deletes one 20.48 MHz cycle from the output and shifts the 2.56 MHz output left by 49 nanoseconds.

The output of counter 450 is the 2.56 MHz system standby clock signal. This signal is fed again through the digital phase comparator 460 until the standby signal is aligned to within 22.5° lag or lead of the active signal.

PLL Switching

Referring again to FIG. 3, switch control 320 is connected between the two PLLs 100a and 100b. Switch control 320 comprises a microcontroller which monitors the two PLLs 100a and 100b and configures which PLL is the active PLL and which is the standby PLL. Switch control 320 generates the handshaking signals necessary for controlling which PLL is the active PLL, controls the actual switching from the active PLL to the standby PLL if the active PLL fails or if the standby equipment is to be checked, etc. Switch control 320 also generates status signals corresponding to various system conditions, such as failure of one PLL (and therefore should not be switched to) and whether two PLLs are present in the system (if not, the system is not configured in the protection configuration, only one PLL is present and thus no phase alignment need take place).

Conclusion

Those skilled in the art will readily recognize and appreciate the benefits of the digitally controlled phase locked loop of the present invention.

Use of a microcontroller to perform the phase comparator filtering and control functions of a phase locked loop has distinct advantages. First, the microcontroller is capable of selecting which of several inputs to use as the loop reference and simultaneously monitoring multiple inputs for frequency, stability and loss of signal.

Second, on most system units an intelligent device such as a microcontroller or microprocessor already exists. So use of that element for phase locked loop control eliminates discrete hardware formerly required for elements such as phase comparators and filtering. Use of a microcontroller also enables implementation of adaptive filtering techniques, whereby a separate algorithm is utilized for obtaining loop capture, or pull in, and another for maintaining loop lock. In addition, because the microcontroller only updates the loop at discrete intervals, output signal jitter at a frequency greater than one-half the loop update rate is virtually eliminated. For example, a microcontroller which performs loop updates every 100 Hz will eliminate virtually all jitter above a frequency of 50 Hz. Also, during failure conditions it is straight forward for a microcontroller to stop updates to the VCXO and set the loop at its centerpoint for free run operation or to implement hold over operation. Finally, in systems which employ multiple phase lock loops, a microcontroller is able to coordinate phase alignment between all clock outputs.

Although specific software configurations and flow diagrams have been illustrated and described for the preferred embodiment of the present invention set forth herein, it will be appreciated by those of ordinary skill in the art that a wide variety of software or firmware implementations calculated to achieve the same purposes maybe substituted for the specific software and firmware algorithm description shown. Thus, although conventional subroutines, decisions and control flow have been described, those skilled in the art will readily recognize that the substitution of a wide variety of alternate control flows, interrupt driven routines, external control mechanisms, and the use of hardware control as opposed to software control could be used without deviating from the spirit and scope of the present invention. Those experienced in the electrical and computer arts will readily appreciate that the present invention may be implemented in a very wide variety of embodiments.

It will therefore be readily apparent to those skilled in the art that many modifications to the preferred embodiment of the present invention as described herein are possible without deviating from the scope and spirit of the present invention. Special conditions employed for the implementation of the preferred embodiment discussed herein are not intended to be limiting and are easily adaptable to alternate implementations. For example, the control structure of the present invention is generally implemented using microprocessor based architectures and logic functions. It will be readily understood by those of skill in the art upon reading and understanding this specification and drawings that the control structure of the present invention may be implemented in a wide variety of ways, including the use of external computer control, RAM microcode control, PLA or PAL logic structures, and other types of hardwired or software controlled state machines. Also, although specific reference, control and output frequencies are described with respect to the preferred embodiment, the present invention is in no way limited to these particular frequencies. In addition, the sampling times, divider values, difference counts, etc. were chosen as the most convenient values corresponding to the particular frequencies discussed with respect to the preferred embodiment. If in an alternate embodiment different frequency values were chosen, the values assigned to these described variables would also change. Those skilled in the electrical and computer arts will also readily recognize this and the fact that such changes would not be outside the scope of the present invention.

While the present invention has been described in connection with a preferred embodiment, it will be understood that many modifications will be readily apparent to those of ordinary skill in the art, and that this application is intended to cover any adaptations or variations thereof. Therefore, it is manifestly intended that this invention be limited only by the claims and the equivalents thereof.

We claim:

1. A clock system, comprising:

first clock means for generating a first derived clock signal that is frequency locked to a reference clock signal; and second clock means for generating a second derived clock signal that is frequency locked to the reference clock signal;

wherein each of the first and second clock means comprise:

a voltage controlled oscillator for generating the respective derived clock signal;

a counter, connected to the oscillator for receiving the respective derived clock signal and the reference clock signal, and for counting a number of pulses of the reference clock signal occurring over a predetermined number of clock periods of the respective derived clock signal; and controller means, connected to the counter and to the oscillator such that the counter, the controller means and the oscillator are connected in a feedback arrangement, for comparing the counted number of pulses of the reference clock signal with an ideal count value, and for generating a control voltage in proportion to a difference obtained therefrom, and wherein the control voltage is applied to the oscillator such that the frequency of the respective derived clock signal varies in a direction which more closely approximates the frequency of the reference clock signal.

2. The system of claim 1 wherein each of the first and second clock means further includes:

phase align means, connected between the oscillator and the counter to receive the respective derived clock signal, and further connected to receive the other derived clock signal, for comparing the phases of the first and second derived clock signals and for shifting the phase of either the first or second derived clock signal such that the phase difference between the first and second derived clock signals approaches 0°.

3. The system according to claim 1, wherein the first and second clock means are connected in a protection configuration in which one of the first or second clock means is designated as an active clock circuit means and the other clock means is designated as a standby clock circuit means, such that in the event of failure of the active clock circuit means, the active clock means can be switched out and the standby clock circuit means can be designated as the active clock circuit means.

4. The system according to claim 3 including switch means, connected between the first and second clock means, for monitoring the first and second clock means and for controlling which of the first or second clock means is designated as the active clock circuit means and which of the first or second clock means is designated as the standby clock circuit means.

5. A clock system, comprising:

first clock circuit means for generating a first derived clock signal that is frequency locked to a reference clock signal; and second clock circuit means for generating a second derived clock signal that is frequency locked to the reference clock signal;

wherein each of the first and second clock circuit means comprise:

an oscillator for generating the respective derived clock signal, the respective derived clock signal having a frequency dependent on a control voltage applied to the oscillator;

a counter, connected to the oscillator, for receiving the respective derived clock signal and the reference clock signal, and for counting a number of pulses of the reference clock signal occurring over a sample period, said sample period defined as a predetermined number of clock periods of the respective derived clock signal;

controller means, connected to the counter and to the oscillator such that the counter, the controller means and the oscillator are connected in a feedback arrangement, for comparing the counted number of pulses of the reference clock signal with an ideal count value corresponding to an ideal frequency, for accumulating the differences obtained therefrom over a predetermined number of sample periods and for generating the control voltage that is proportional to the accumulated difference, wherein the control voltage is applied to the oscillator such that the frequency of the respective derived clock signal varies in a direction which more closely approximates the frequency of the reference clock signal; and phase align means, connected between the oscillator and the counter to receive the respective derived clock signal, and further connected to receive the other derived clock signal, for comparing the phases of the first and second derived clock signals, producing a control signal in relation to the difference obtained therefrom, and for shifting the phase of the first or second derived clock signal in response to the control signal such that the phase difference between the first and second derived clock signals approaches 0°.

6. The system according to claim 5, wherein the first and second clock circuit means are connected in a protection configuration in which one of the first or second clock circuit means is designated as an active clock circuit means and the other clock circuit means is designated as a standby clock circuit means, wherein only the active clock circuit means is providing the system clock signal, and wherein in the event of failure of the active clock circuit means, the standby clock circuit acts as the active clock circuit means.

7. A clock system, comprising:

a first clock adapted to generate a first derived clock signal that is frequency locked to a reference clock signal; and a second clock adapted to generate a second derived clock signal that is frequency locked to the reference clock signal;

wherein each of the first and second clocks comprise:

a voltage controlled oscillator which outputs the respective derived clock signal, wherein the respective derived clock signal has a frequency dependent on a control voltage applied to the oscillator;

a counter, connected to receive the respective derived clock signal and the reference clock signal, said counter adapted to count a number of pulses of the reference clock signal occurring over a sample period, wherein said sample period is defined as a predetermined number of clock periods of the respective derived clock signal;

a controller, connected to the counter and to the oscillator such that the counter, the controller and the oscillator are connected in a feedback arrangement; and a phase aligner, connected between the oscillator and the counter to receive the respective derived clock signal, and further connected to receive the other derived clock signal;

wherein said controller further includes:

comparator means for comparing the counted number of pulses of the reference clock signal with an ideal count value corresponding to an ideal frequency;

accumulator means for accumulating the differences obtained therefrom over a predetermined number of sample periods; and means for generating the control voltage, wherein said control voltage is proportional to the accumulated differences, and wherein the control voltage is applied to the oscillator such that the frequency of the respective derived clock signal varies in a direction which more closely approximates the frequency of the reference clock signal;

wherein said phase aligner further includes:

phase comparator means for comparing the phases of the first and second derived clock signals and for producing a control signal in relation to the difference obtained therefrom; and phase shift means for shifting the phase of the first or second derived clock signal in response to the control signal such that the phase difference between the first and second derived clock signals approaches 0°.

8. An apparatus for frequency locking a derived clock signal to a reference clock signal, comprising:

a voltage controlled oscillator for generating the derived clock signal;

a counter, connected to receive the derived and reference clock signals, the counter adapted to count a number of pulses of the reference clock signal occurring over a predetermined number of dock periods of the derived clock signal; and controller means, connected to the counter and to the oscillator such that the counter, the controller means and the oscillator are connected in a feedback arrangement, for comparing the counted number of pulses of the reference clock signal with an ideal count value, and for generating a control signal in proportion to a difference obtained therefrom, wherein the control signal is applied to the oscillator such that the frequency of the derived clock signal varies in a direction which more closely approximates the frequency of the reference clock signal;

the controller means further including means for capturing an initial measurement of the error between the reference clock signal and the derived clock signal and making an initial adjustment to the control signal and calibrating one or more loop gain coefficients to be used in subsequent updates of the control signal.

9. The apparatus of claim 8 further wherein said controller means includes a second means for determining the accuracy of the loop gain coefficients and making an adjustment thereto.

10. The apparatus of claim 9 further wherein said controller means includes means for operating in a normal mode wherein the loop gain coefficients are used for determining corrections to the control signal.

11. An apparatus for frequency locking a derived clock signal to a reference clock signal, comprising:

a voltage controlled oscillator for generating the derived clock signal;

a counter, connected to receive the derived and reference clock signals, the counter adapted to count a number of pulses of the reference clock signal occurring over a predetermined number of clock periods of the derived clock signal; and controller means, connected to the counter and to the oscillator such that the counter, the controller means and the oscillator are connected in a feedback arrangement, for comparing the counted number of pulses of the reference clock signal with an ideal count value, and for generating a control signal in proportion to a difference obtained therefrom, wherein the control signal is applied to the oscillator such that the frequency of the derived clock signal varies in a direction which more closely approximates the frequency of the reference clock signal;

the controller means further including means for capturing an initial measurement of the error between the reference clock signal and the derived clock signal and making an initial adjustment to the control signal and calibrating one or more loop gain coefficients to be used in subsequent updates of the control signal; and the controller means further including means for controlling the control signal to cause the signal to dither the difference between the counted number of pulses and ideal count value.

12. A system according to claim 5 further wherein the controller means includes means for generating the derived clock signal in a hold-over mode of operation unsynchronized to the reference signal, and further wherein the phase align means includes means for causing said controller means to switch to the hold-over mode of operation prior to phase aligning the first and second derived clock signals.

13. The system according to claim 6, wherein the standby clock circuit means is switched for the active clock circuit means during an interval of time of nontransition by the active clock circuit means and the standby clock circuit means.

14. The system according to claim 10, wherein the normal mode operates at a first update rate that is faster than a second update rate utilized by the capturing means and the second means for determining the accuracy of the loop gain coefficients.

* * * * *

UNITED STATES PATENT AND TRADEMARK OFFICE
CERTIFICATE OF CORRECTION

PATENT NO. : 5,726,607
DATED : March 10, 1998
INVENTOR(S) : Jeffrey Brede et al.

It is certified that error appears in the above-identified patent and that said Letters Patent is hereby corrected as shown below:

On the title page

At [75] Inventors, please show Adam Opoczynski resides in Plano, Texas.

At Col. 10, line 40, please delete "+360" and insert --±360--.

At Col. 11, line 1, please delete "FIGS." and insert --FIG.--.

At Col. 12, line 33, please delete "a flame or" and insert --a frame or--.

At Col. 12, line 40, please delete "clock, This" and insert --clock. This--.

At Col. 12, line 46, please delete "the two dock" and insert --the two clock--.

At Col. 12, line 65, please delete "the firmware" and insert --The firmware--.

At Col. 17, line 30, please delete "difference, wherein" and insert --differences, wherein--.

At Col. 18, line 45, please delete "of dock periods" and insert --of clock periods--.

At Col. 19, line 5, please delete "derived dock signal" and insert --derived clock signal--.

Signed and Sealed this

Ninth Day of March, 1999

Attest:

Q. TODD DICKINSON

*Attesting Officer*

*Acting Commissioner of Patents and Trademarks*